United States Patent [19]

Miyamoto

[11] Patent Number: 4,541,714

[45] Date of Patent: Sep. 17, 1985

[54] EXPOSURE CONTROL METHOD

[75] Inventor: Hiroshi Miyamoto, Tokyo, Japan

[73] Assignee: CRC Manufacturing Co., Ltd., Chofu, Japan

[21] Appl. No.: 520,320

[22] Filed: Aug. 4, 1983

[30] Foreign Application Priority Data

Aug. 4, 1982 [JP] Japan ................. 57-135945

[51] Int. Cl.[4] ............................. G03B 27/04
[52] U.S. Cl. ............................. 355/99; 355/53
[58] Field of Search .............. 355/99, 102, 77, 53

[56] References Cited

U.S. PATENT DOCUMENTS

| | | | |
|---|---|---|---|
| 3,007,697 | 11/1961 | Mosemiller | 271/90 |
| 3,272,549 | 9/1966 | Nisula | 271/90 |
| 4,226,526 | 10/1980 | Spence-Bate et al. | 355/53 |
| 4,327,906 | 5/1982 | Frohlich et al. | 271/90 |
| 4,451,144 | 5/1984 | Gensike | 355/99 |

*Primary Examiner*—Monroe H. Hayes
*Attorney, Agent, or Firm*—Fidelman, Wolffe and Waldron

[57] ABSTRACT

A stack of aligned workpieces is placed in a frame body, and a mask is positioned over the stack of workpieces in alignment therewith. The frame body is then moved into an exposure device in which the mask is transferred from the frame body onto a transparent plate and the workpieces are transferred successively from the frame body onto the transparent plate. The workpieces are exposed successively to the mask. The exposed workpieces are then discharged successively out of the exposure device. The mask is transferred from the transparent plate back to the frame body after all of the workpieces have been exposed. The frame body with the mask carried therein is moved out of the exposure device.

3 Claims, 1 Drawing Figure

# EXPOSURE CONTROL METHOD

BACKGROUND OF THE INVENTION

The present invention relates to an exposure control method for controlling exposure of workpieces such as printed-circuit boards.

Printed-circuit boards or other workpieces to be exposed to light for pattern formation are combined with a mask having a predetermined pattern in exposing the workpiece to an image corresponding to the pattern with an exposure device. Since it is general practice to expose a multiplicity of workpieces successively to a single mask pattern, the mask and the workpieces are treated separately from each other. More specifically, a mask is manually attached to a transparent plate in an opened exposure unit in an exposure device, and then a desired number of workpieces are supplied into the exposure apparatus in which they are attached individually and sequantially to the transparent plate. Thereafter, the workpieces are exposed and taken out of the exposure apparatus.

The foregoing prior exposure control process has proven relatively convenient in the case where a multiplicity of workpieces are successively exposed with a single mask. However, exposure of a relatively small number of workpieces, say 20, with a single mask or two masks for both-sided exposure, makes it quite tedious and time-consuming to attach and remove the workpieces to and from the transparent plate.

The conventional exposure device suffers from various other disadvantages. Specifically, since the transparent plate is positioned centrally in the exposure unit in the exposure device, it is troublesome to open the exposure unit to expose the transparent plate out of the exposure device. During the mask attachment process, airborne dust particles tend to be attracted to the exposed transparent plate and the mask attached thereto, resulting in a greater yield of defective products. Various mechanisms in the exposure device are arranged and driven around the central transparent plate therein. Therefore, no sufficient space is available around the transparent plate for easy manual operation to attach and remove the masks to and from the transparent plate. Masks are marked with many symbols indicative of the kinds of the masks. The marked area is contiguous to an outer peripheral grip edge portion of a certain width which is to be gripped for attachment or removal, so that the markings will be prevented from being rendered illegible by dirt from fingers at the time of handling the mask. Such a grip zone reduces a mask area available for the mask pattern.

In an effort to eliminate the above prior art difficulties, there has recently been devised an exposure device with a container disposed adjacent thereto which houses therein turrets accommodating respective masks and turrets each accommodating a desired number of workpieces, the turrets being vertically displaceably arranged as a stack. In operation, a turret carrying a desired mask to be used is vertically moved to a prescribed position, and then moved into the exposure device and stopped in position over the transparent plate. Thereafter, the mask is lifted out of the turret by a transfer mechanism in the exposure device, during which time the turret is retracted into the container, and the transfer mechanism is lowered to position the mask over the transparent plate. Subsequently, a turret with a workpiece accommodated therein is advanced over the transparent plate and the workpiece is mounted in position over the transparent plate. Then, the workpiece is exposed to light. This arrangement can eliminate various shortcomings related to the handling of masks as the masks can be automatically attached and detached with respect to the transparent plate. However, because the container and a computer for controlling movement of the container under a program are necessary, the cost of the overall installation is increased and a space needed for operating the exposure device is large. In addition, a turret with a workpiece carried therein must be moved from the container toward the transparent plate and vice versa each time a workpiece is to be positioned over the transparent plate, a process which results in an increased period of time required for a single workpiece to be exposed. Therefore, the rate of production is relatively poor.

SUMMARY OF THE INVENTION

According to an exposure control method of the present invention, a stack of aligned workpieces is placed in a frame body, and a mask is positioned over the stack of workpieces in alignment therewith. The frame body is then moved into an exposure device in which the mask is transferred from the frame body onto a transparent plate and the workpieces are transferred successively from the frame body onto the transparent plate. The workpieces are exposed successively to the mask. The exposed workpieces are then discharged successively out of the exposure device. The mask is transferred from the transparent plate back to the frame body after all of the workpieces have been exposed. The frame body with the mask carried therein is moved out of the exposure device.

It is an object of the present invention to provide an exposure control method capable of handling a mask and workpieces together in supplying them into an exposure device.

Another object of the present invention is to provide an exposure control method for handling a mask easily and correctly with respect to workpieces to be exposed and an exposure device.

Still another object of the present invention is to provide an exposure control method for achieving better exposure of workpieces.

A still further object of the present invention is to provide an exposure control method capable of exposing workpieces inexpensively with a relatively simple exposure device.

The above and other objects, features and advantages of the present invention will become more apparent from the following description when taken in conjunction with the accompanying drawing in which a preferred embodiment of the present invention is shown by way of illustrative example.

BRIEF DESCRIPTION OF THE DRAWING

The sole FIGURE is a schematic view of an exposure control apparatus for effecting an exposure control method according to the present invention.

DESCRIPTION OF THE PREFERRED EMBODIMENT

Figure 1:
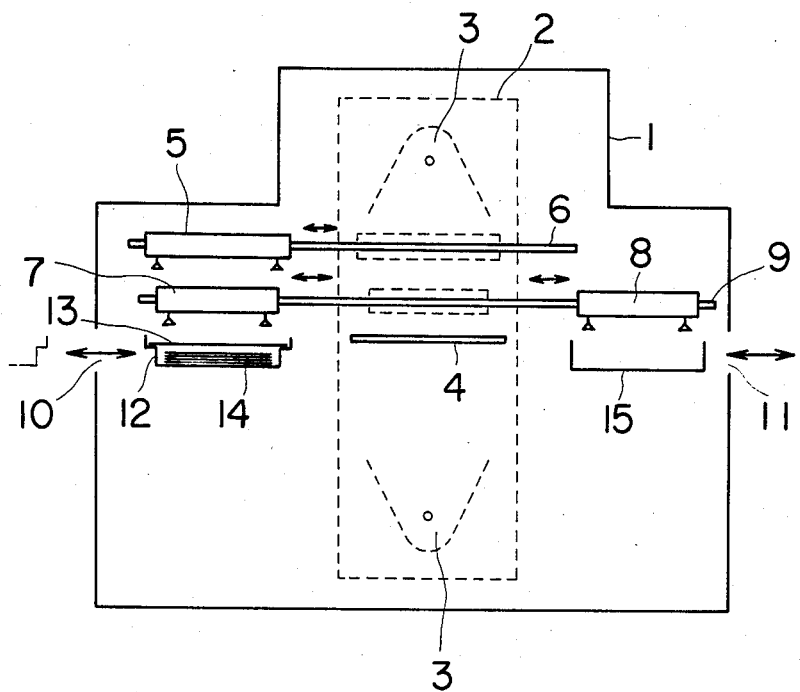

As shown in the single drawing, a frame body 12 in the form of a thin box with an upper side open is freely movable into and out of an exposure device 1 through a loading inlet 10. A mask 13 having a desired pattern for one-sided exposure or two masks 13 each having a desired pattern for both-sided exposure, and a desired number of workpieces 14 to be exposed are aligned and stacked in the frame body 12, the mask or masks 13 being placed over the stacked workpieces 14.

The mask or masks 13 and the workpieces 14 are positioned correctly with respect to the frame body 12 and to each other. The frame body 12 with the mask or masks 13 and the workpieces 14 contained therein are moved by a suitable transfer mechanism into the exposure device 1.

When the frame body 12 is positioned in the exposure device 1, the mask or masks 13 are taken by a mask transfer mechanism 5 in the exposure device 1 out of the frame body 12, transferred along a rail 6 to a position directly above a transparent plate 4 in an exposure unit 2 in the exposure device 1, and then fixed in position to the transparent plate 4.

The mask or masks 13 are immovably secured in position to the transparent plate 4 by a known vacuum means.

After the mask or masks 13 have been attached to the transparent plate 4, the uppermost workpiece 14 is picked up from the frame body 12 by a workpiece transfer mechanism 7, transferred along a rail 9 onto the transparent plate 4, and then fixed in position to the transparent plate 4.

Thereafter, the workpiece 14 thus set on the transparent plate 4 is exposed to light emitted from light sources 3 in a normal exposure process.

The exposed workpiece 14 is removed from the transparent plate 4 by a workpiece discharge mechanism 8 and discharged thereby out of the exposure device 1 for post-treatment.

After the uppermost workpiece 14 from the frame body 12 has been exposed, the successive workpieces 14 are taken out of the frame body 12 and sequentially exposed in the manner described above.

When all of the workpieces 14 contained in the frame body 12 have been exposed, the mask or masks 13 are detached by the mask transfer mechanism 5 from the transparent plate 4 and transferred back to the frame body 12. The frame body 12 with the mask or masks 13 contained is then moved out of the exposure device 1, and the exposure device 1 is now readied for a next frame body 12 with a desired mask or masks 13 and workpieces 14 carried therein.

The mask transfer mechanism 4, the workpiece transfer mechanism 7 and the workpiece discharge mechanism 8 are arranged to pick up the mask or masks 13 and the workpieces 14 under vacuum for transferring them along the rails 6 and 9. This allows the mask or masks 13 and the workpieces 14 to be kept aligned and handled easily.

The mask transfer mechanism 5 and the workpiece transfer mechanism 7 are of an identical construction and may be a single mechanism for transferring both the mask and the workpieces. However, it is preferred to provide the mask transfer mechanism 5 and the workpiece transfer mechanism 7 separately as shown since the mask 13 is normally greater in size than the workpieces 14 and the mask or masks 13 should not be placed directly on the workpieces 14 in the frame body 12.

Likewise, the workpiece transfer mechanism 7 and the workpiece discharge mechanism 8 may be a single mechanism for transferring and discharging the workpieces 14. However, they should be provided separately as shown to shorten the exposure control time for efficient exposure control.

In the illustrated embodiment, the exposed workpieces 14 are placed on a pallet 15 and the pallet 15 is discharged out of the exposure device 1 through a discharge outlet 11. However, the exposed workpieces 14 may be discharged by a belt conveyor as with prior exposure devices.

With the arrangement of the exposure control method according to the present invention, the mask or masks 13 having a desired pattern and the workpieces 14 to be exposed are contained together in the frame body 12, and the frame body 12 is supplied into the exposure device 1, so that the set of mask or masks 13 and workpieces 14 can be handled together for successive exposure. The attachment of the mask or masks 13 and the exposure of the workpieces 14 can be carried out in a single exposure control operation.

According to the prior art exposure control, masks and workpieces are supplied and set in an exposure device in separate and independent processes. The workpieces cannot be supplied and set until the masks are supplied and set in the exposure device. Furthermore, the masks and the workpieces should be separately aligned and hence they should be confirmed independently for their proper positioning. Therefore, the exposure control has required an increased period of time and involved an increased number of control steps.

According to the present invention, however, the mask or masks 13 and the workpieces 14 which have been aligned with each other in advance are stored in the single frame body 12 and then supplied into the exposure device 1. Therefore, the mask or masks 13 and the workpieces 14 can be fed into the exposure device 1 in a single operation without the need for positional alignment in the exposure device 1.

Since the mask or masks 13 are stacked on the workpieces 14 in the frame body 12, the mask or masks 13 and then the workpieces 14 can successively be attached to the transparent plate 4 through simple control of the transfer mechanisms for transferring the mask or masks 13 and the workpieces 14 for attachment to the transparent plate 4.

The frame body 12 with the mask or masks 13 and the workpieces 14 contained therein do not enter the exposure unit 2 in the exposure device 1. The exposure unit 2 with various mechanisms positioned therein is therefore free from a complex construction which would otherwise result from the frame body being movable into and out of the exposure unit. Since only the mask or masks 13 and the workpieces 14 are movable into and out of the exposure unit 2, entry of dust, dirt or unwanted airborne particles is largely reduced for better exposure conditions and exposure operations.

The mask or masks 13 and the workpieces 14 can be aligned and assembled in the frame body 12 outside of the exposure device 1 without any limitations on time and space, using suitable equipment. Therefore, the mask or masks 13 and the workpieces 14 can be aligned correctly and easily in the frame body 12. Through the use of an appropriate device, the mask or masks 13 can be placed into the frame body 12 without the use of fingers. In the absence of the danger of finger dirt to be applied to a peripheral edge of the mask, the latter can provide a wider surface available for a pattern.

Since a mask or masks 13 and a desired number of workpieces 14 are contained in a single frame body 12 and supplied together into an exposure device 1, the present invention is particularly advantageous when employed in applications in which a relatively small number of workpieces are to be exposed to a required pattern.

Although a certain preferred embodiment has been shown and described, it should be understood that many changes and modifications may be made therein without departing from the scope of the appended claims.

What is claimed is:

1. A method of handling workpieces and masks in a duplication process, said method comprising the steps of:

placing a stack of workpieces in a frame body in a stackwise aligned relation;

positioning a mask in said frame body and over the stack of workpieces and in a preferred alignment therewith;

moving said frame body to a first fixed position within an exposure device;

transferring said mask from said frame body and mounting said mask onto a transparent plate at a second fixed position in the exposure device;

transferring said workpieces individually and successively from said frame body onto said mask at said second fixed position of said transparent plate;

exposing said workpieces successively and repeatably duplicating a pattern on said workpieces according to said mask;

discharging said exposed workpieces successively away from said second fixed position of said exposure device;

transferring said mask from said transparent plate back to said frame body after all of said workpieces have been exposed; and moving said frame body with said mask carried therein out of said exposure device.

2. A method according to claim 1, and further comprising the step of:

transferring said mask and said workpieces by respectively separate transfer mechanisms.

3. A method according to claim 1, and further comprising the step of:

discharging said exposed workpieces from said transparent plate to a pallet by a discharge mechanism and from said exposure device by said pallet.

* * * * *

UNITED STATES PATENT AND TRADEMARK OFFICE
CERTIFICATE OF CORRECTION

PATENT NO. : 4,541,714
DATED : September 17, 1985
INVENTOR(S) : Hiroshi Miyamoto It is certified that error appears in the above-identified patent and that said Letters Patent are hereby corrected as shown below:

On the title page:

At [73] please correct the assignee's name to read --ORC Manufacturing Co., Ltd., Chofu, Japan--.

Signed and Sealed this

Twenty-fifth Day of February 1986

[SEAL]

Attest:

DONALD J. QUIGG

Attesting Officer

Commissioner of Patents and Trademarks